(12) United States Patent
Baba

(10) Patent No.: US 6,317,333 B1
(45) Date of Patent: Nov. 13, 2001

(54) PACKAGE CONSTRUCTION OF SEMICONDUCTOR DEVICE

(75) Inventor: Shinji Baba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/427,583

(22) Filed: Oct. 27, 1999

Related U.S. Application Data

(63) Continuation-in-part of application No. 09/061,022, filed on Apr. 16, 1998, now abandoned.

(30) Foreign Application Priority Data

Aug. 28, 1997 (JP) .................................................. 9-231927

(51) Int. Cl.$^7$ ..................................................... H05K 1/03
(52) U.S. Cl. ......................... 361/795; 361/719; 361/767; 361/768; 361/792; 174/255; 257/691; 257/700; 257/701; 257/702; 257/786
(58) Field of Search ..................... 361/719, 767, 361/768, 792, 794, 795; 174/255, 260; 257/691, 700, 701, 702, 704, 707, 723, 737, 738, 778, 786

(56) References Cited

U.S. PATENT DOCUMENTS

| | | | |
|---|---|---|---|
| 3,871,015 | 3/1975 | Lin et al. ........................... | 257/779 |
| 4,604,644 | 8/1986 | Beckham et al. ................... | 257/737 |
| 4,963,697 | * 10/1990 | Peterson et al. ................... | 361/792 |
| 5,103,293 | * 4/1992 | Bonafino et al. ................... | 257/702 |
| 5,313,366 | * 5/1994 | Gaudenzi et al. .................. | 361/795 |
| 5,450,283 | * 9/1995 | Lin et al. ........................... | 257/787 |
| 5,475,624 | 12/1995 | Sudo et al. ......................... | 257/723 |
| 5,483,421 | * 1/1996 | Gedney et al. ..................... | 361/795 |
| 5,574,630 | 11/1996 | Kresge et al. ...................... | 361/792 |
| 5,585,671 | * 12/1996 | Nagesh et al. ..................... | 257/778 |
| 5,635,767 | * 6/1997 | Wenzel et al. ..................... | 257/691 |
| 5,710,071 | * 1/1998 | Beddingfield et al. ............. | 257/778 |
| 5,760,469 | 6/1998 | Higashiguchi et al. ............ | 257/678 |
| 5,785,799 | * 7/1998 | Culnane et al. ................. | 156/379.7 |
| 5,796,171 | * 8/1998 | Koc et al. .......................... | 257/786 |
| 5,814,891 | * 9/1998 | Hirano ............................... | 257/786 |
| 5,841,075 | * 11/1998 | Hanson .............................. | 174/255 |

(List continued on next page.)

FOREIGN PATENT DOCUMENTS

| | | |
|---|---|---|
| 43 25 668 | 2/1994 | (DE) . |
| 0 713 359 | 5/1996 | (EP) . |
| 0 883 173 | 9/1998 | (EP) . |
| 6209055 | * 7/1994 | (JP) . |
| 8330474 | * 12/1996 | (JP) . |
| 98460 | * 1/1997 | (JP) . |
| 9-45809 | 2/1997 | (JP) . |
| 9-64090 | 3/1997 | (JP) . |

OTHER PUBLICATIONS

Thermische Modellierung von Ball Grid Arrays:, Electronik, Aug. 1997, pp. 142–144.

Andros et al., "TBGA Package Technology", IEEE Transactions on Components, Packaging, and Manufacturing Technology, Part B, vol. 17, No. 14, Nov. 1994, pp. 564–568.

Primary Examiner—Jeffrey Gaffin
Assistant Examiner—John B. Vigushin
(74) Attorney, Agent, or Firm—Leydig, Voit & Mayer, Ltd.

(57) ABSTRACT

A semiconductor device includes a ball grid array substrate including an upper insulating layer of laminated insulating layers, an intermediate insulating layer, and a lower insulating layer of laminated insulating layers; lines on each top surface of the insulating layers included in the upper insulating layer, the intermediate insulating layer, and the lower insulating layer, respectively; and a semiconductor chip having electrodes connected to the lines, the semiconductor chip being connected with solder balls through via holes in each of the insulating layers, the solder balls being located on an outermost surface of the lower insulating layer.

5 Claims, 5 Drawing Sheets

U.S. PATENT DOCUMENTS

| | | | |
|---|---|---|---|
| 5,849,606 | | 12/1998 | Kikuchi et al. ........................ 438/108 |
| 5,952,726 | * | 9/1999 | Liang .................................... 257/786 |
| 5,969,426 | * | 10/1999 | Baba et al. ........................... 257/778 |
| 6,008,543 | * | 12/1999 | Iwabuchi .............................. 257/786 |
| 6,014,317 | * | 1/2000 | Sylvester .............................. 361/795 |
| 6,088,233 | * | 7/2000 | Iijima et al. ......................... 361/719 |
| 6,097,097 | * | 8/2000 | Hirose .................................. 257/691 |

* cited by examiner

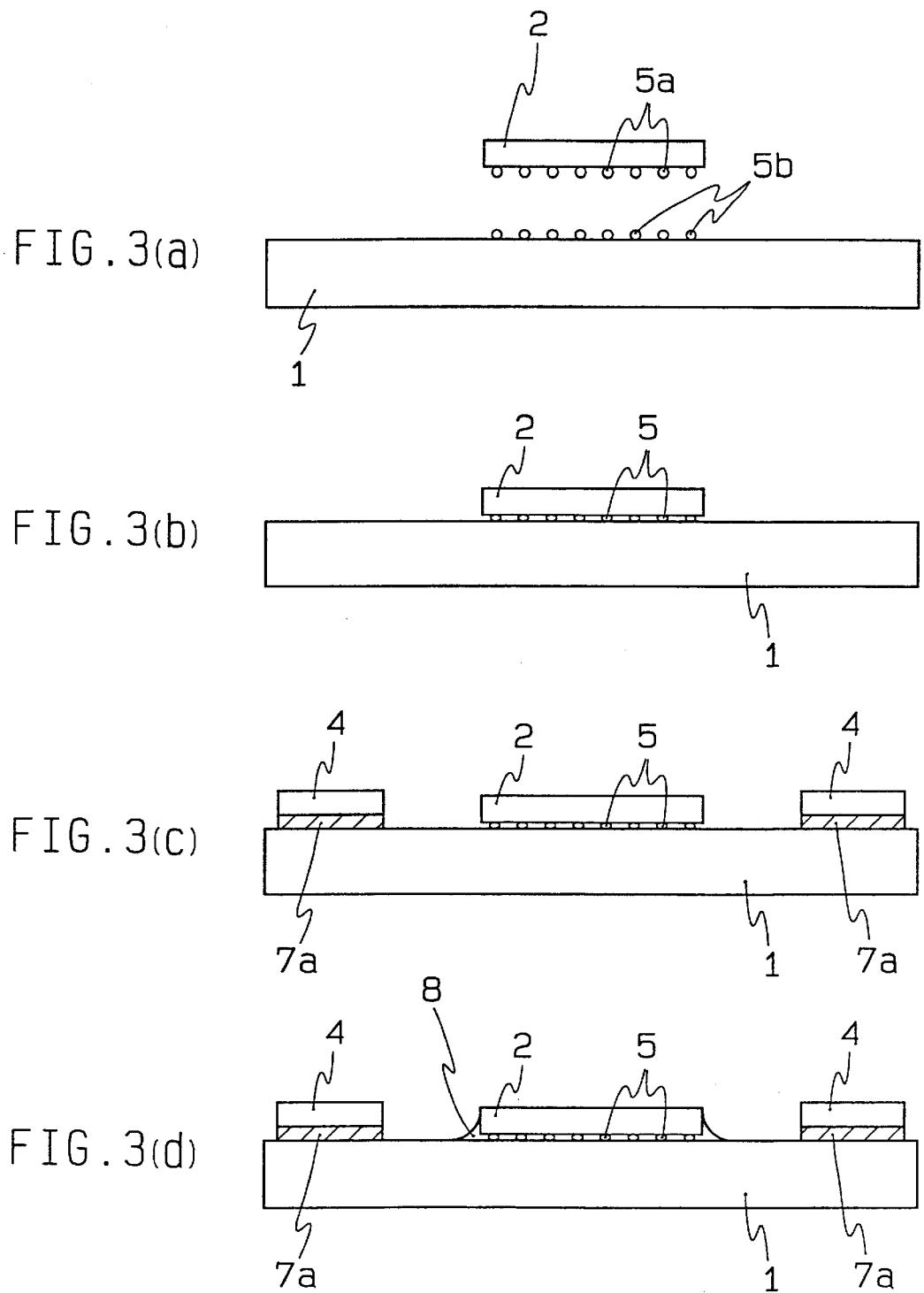

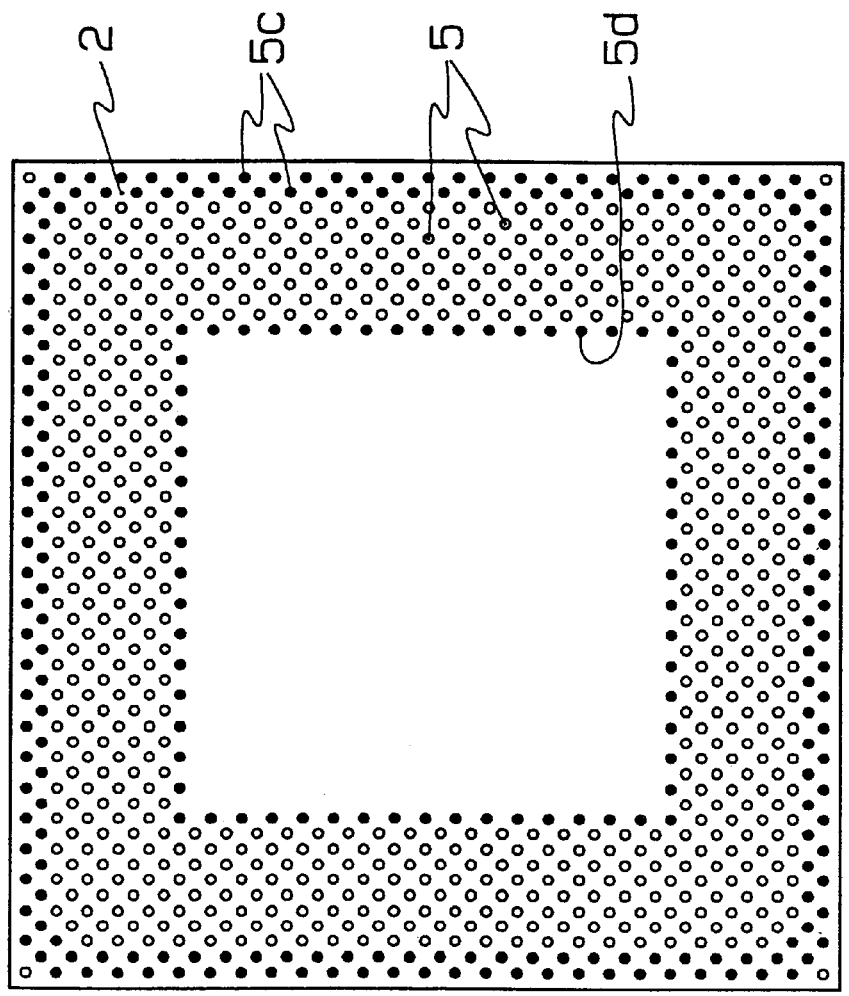

PACKAGE CONSTRUCTION OF SEMICONDUCTOR DEVICE

CROSS-REFERENCE TO RELATED APPLICATIONS

This is a continuation-in-part of application Ser. No. 09/061,022 filed on Apr. 16, 1998, now abandoned.

BACKGROUND OF THE INVENTION

The present invention relates to a package construction of semiconductor device, and more particularly to a package construction of semiconductor device having a BGA (Ball Grid Array) construction wherein solder balls used for soldering when mounting the semiconductor device are arranged on the rear surface of the substrate in the form of matrix.

In general, as disclosed in, for example, Japanese Unexamined Patent Publication No. 330474/1996, plastic packages, metal packages, and ceramic packages are used for packaging a semiconductor element. Among these packages, the ceramic package is used for packaging of CMOS gate arrays, ECL gate arrays, etc. because of its insulating and heat radiation capabilities as well as its moisture resistance.

For example, in Japanese Unexamined Patent Publication No. 8359/1996, there is disclosed BGA package which has been used as one type of surface mounting type package of plastic packages. The BGA package is manufactured by arranging solder bumps in the form of a matrix on the surface on the semiconductor chip side of the substrate on which the semiconductor chip is arranged, arranging spherical solder balls in the form of a matrix on the surface opposite to the semiconductor chip, arranging the semiconductor chip on the substrate surface, and sealing with resin or potting. In particular, the BGA package is used as a multi-pin package having more than 200 pins. Now, the construction in which solder balls serving as external electrodes are arranged in the form of a matrix on the rear surface of the substrate is called the BGA construction. Packaging the semiconductor device by this BGA construction is called BGA package, and the substrate with insulating layers laminated to form the BGA construction is called the BGA substrate.

In the case of this BGA package, organic material (or organic material containing non-organic material) hereinafter referred to as "organic material", might be used for the substrate material, but when this BGA package semiconductor device is mounted on a substrate surface, the difference in thermal expansion among the semiconductor chip, BGA substrate, and substrate mounted with a semiconductor device (hereinafter called the "circuit board") creates a problem.

The solder balls serving as external electrodes are provided on the surface opposite to the semiconductor chip of the BGA substrate and solder bumps are provided on the surface on the semiconductor chip side. The thermal expansion coefficient of the BGA substrate is greater on the outermost circumferential side, and stress generated by the thermal expansion is the greatest there. For this reason, there arises a problem that disconnection of solder bump for joining the semiconductor chip occurs or the semiconductor chip itself peels off.

If the BGA substrate is made of ceramic material, fine line design is possible with respect to interlayer connection lines by integral sintering, and signal lines in the substrate can be optionally designed. However, in the case of an organic material, there is employed a buildup manufacturing method in which an insulating layer must first be formed, signal lines are wired to this insulating layer, via holes for interlayer connections are formed in the insulating layer, the next layer is formed on this top layer, and the signal lines and via holes are provided. Therefore, there are many restrictions in line design, and the material of BGA construction and signal line capable of solving the thermal expansion problems have not yet been obtained.

An object of the present invention is to provide a semiconductor device of the BGA construction with a high reliability, free of solder bump disconnection and removal of a semiconductor chip even when thermal stress is generated by thermal expansion.

SUMMARY OF THE INVENTION

A semiconductor device according to the present invention comprises a BGA substrate composed of an upper insulating layer in which a plurality of insulating layers are laminated, an intermediate insulating layer, and a lower insulating layer in which a plurality of insulating layers are laminated;

a plurality of lines provided on each top surface of the insulating layers included in the upper insulating layer, the intermediate insulating layer, and the lower insulating layer, respectively;

a plurality of solder balls provided on the outermost surface of the lower insulating layer; and a semiconductor chip having a plurality of electrodes to be connected to the plurality of lines respectively, the semiconductor chip being connected electrically with the plurality of solder balls through a plurality of via holes provided in each of the insulating layers, wherein a material for the insulating layers comprises an organic material which fits thermal expansion characteristics of a circuit board on which the semiconductor device is mounted.

In a semiconductor device of this invention having the thermal expansion characteristics of the circuit board expressed by the coefficient of linear expansion, wherein the difference of linear thermal expansion coefficient between the intermediate layer of the BGA substrate and the circuit board is within $1 \times 10^{-5}/°$ C., and the difference of linear thermal expansion coefficients among the materials within the BGA substrate is within $1 \times 10^{-4}/°$ C.

A semiconductor device according to the invention contains at least one of the epoxy resin and tetrafluoroethylene resin for the organic material.

A semiconductor device of this invention comprises a BGA substrate composed of an upper insulating layer in which a plurality of insulating layers are laminated, an intermediate insulating layer, and a lower insulating layer in which a plurality of insulating layers are laminated;

a plurality of lines provided on top surfaces of the insulating layers included in the upper insulating layer, the intermediate insulating layer, and the lower insulating layer, respectively;

a plurality of solder balls provided on the outermost surface of the lower insulating layer; and a semiconductor chip having a plurality of electrodes to be connected to the plurality of lines respectively, the semiconductor chip being connected electrically with the plurality of solder balls through a plurality of via holes provided in each of the insulating layers, wherein the plurality of electrodes are provided in a peripheral region of the semiconductor chip, and the power supply and ground are connected to electrodes on outermost circumferential rows and innermost circumferential rows, respectively.

A semiconductor device according to this invention comprises a BGA substrate composed of an upper insulating layer in which a plurality of insulating layers are laminated, an intermediate insulating layer, and a lower insulating layer in which a plurality of insulating layers are laminated;

a plurality of lines provided on top surfaces of the insulating layers included in the upper insulating layer, the intermediate insulating layer, and the lower insulating layer respectively;

a plurality of solder balls provided on the outermost surface of the lower insulating layer; and a semiconductor chip having a plurality of electrodes to be connected to the plurality of lines respectively, wherein the semiconductor chip is connected electrically with the plurality of solder balls through a plurality of via holes provided in each of the insulating layers; the semiconductor device further including a sealing member comprising sealing resin to bring the semiconductor chip in close contact with the BGA substrate, a heat spreader for discharging heat generated in the semiconductor chips to the outside, a ring providing a specified clearance between the BGA substrate and the heat spreader as well as joining them, wherein a material for the insulating layers comprises organic material which fits to the thermal expansion characteristics of a circuit board on which the semiconductor device is mounted.

BRIEF DESCRIPTION OF THE DRAWINGS

FIGS. 3(a)–3(d) are sectional views of one example of a manufacturing process of the semiconductor device according to this invention;

FIG. 5 is a plan view showing solder bumps on a semiconductor chip surface in the form of peripheral rows.

DETAILED DESCRIPTION OF THE PREFERRED EMBODIMENTS

Now, description will be made on the embodiment of the construction of the semiconductor device according to the present invention.

Embodiment 1

Referring now to drawings, there is shown one preferred embodiment of the semiconductor device according to this invention.

The semiconductor device of the present invention comprises a BGA substrate, semiconductor chip arranged on the BGA substrate, a heat spreader discharging heat generated in the semiconductor chip to the outside, a ring for providing a specified clearance between the BGA substrate and the heat spreader as well as joining them. The BGA substrate has a multi-layer construction in which a plurality of insulating layers are superimposed, and including in each of the insulating layers a plurality of lines and via holes. The BGA substrate has specified lines connected to one another through via holes when a plurality of insulating layers are superimposed, and it is possible for a plurality of lines to three-dimensionally cross one another via the insulating layers, and downsizing of the semiconductor device can be achieved.

Figure 1:
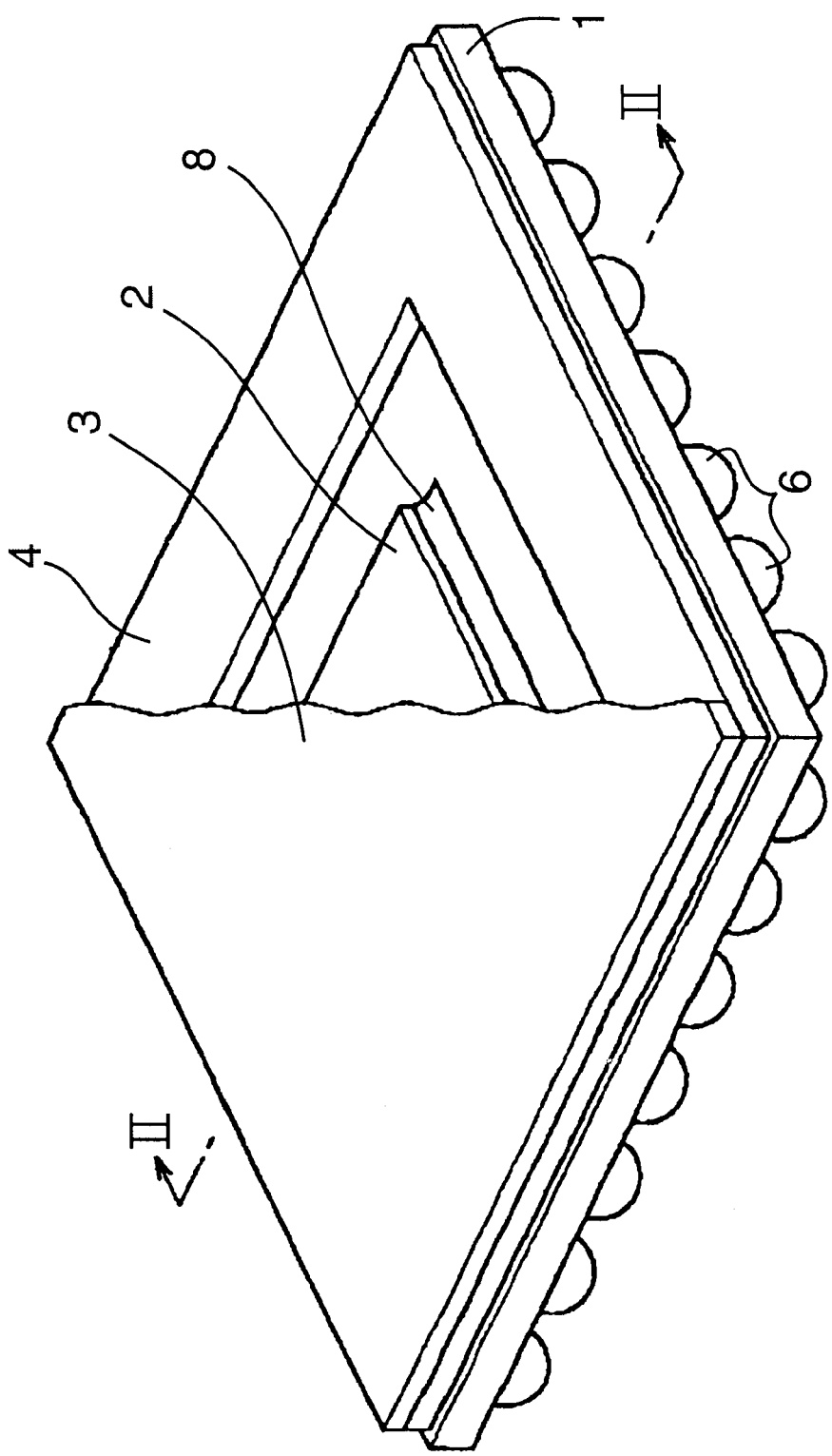
FIG. 1 is a partially cutaway view in perspective of one embodiment of the semiconductor device according to this invention.
Figure 2:
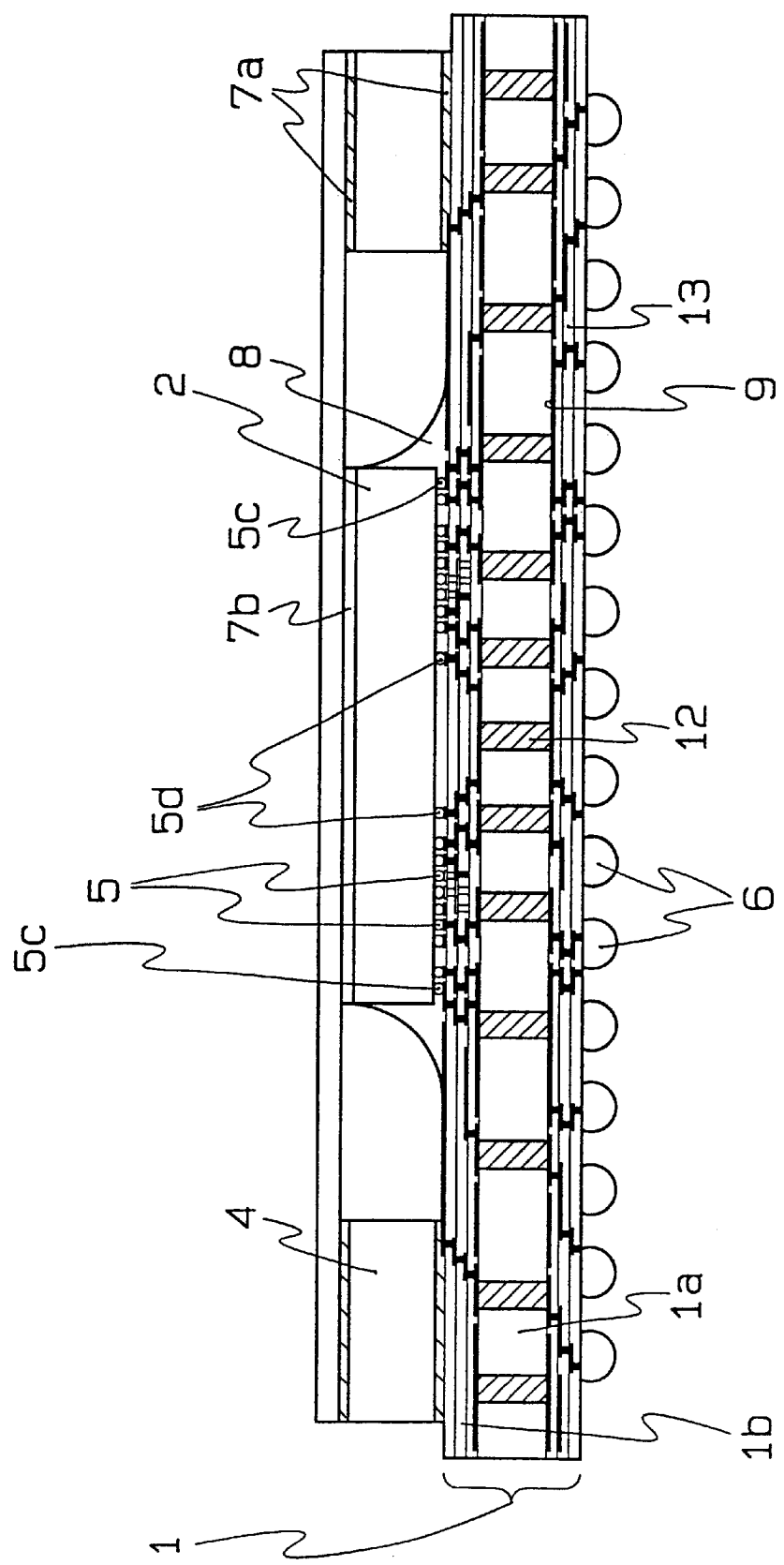
FIG. 2 is a sectional view showing one embodiment of the semiconductor device according to this invention.
Figure 4A:
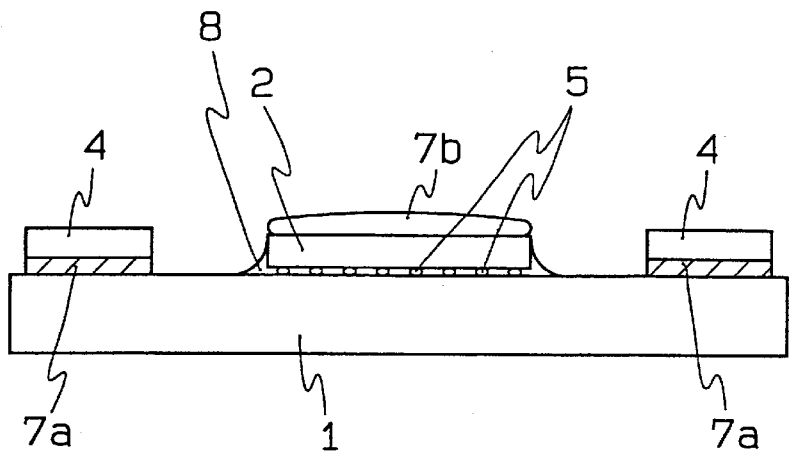
FIGS. 4(a)–4(c) are sectional views of one example of a manufacturing process of the semiconductor device according to this invention.
Figure 4B:
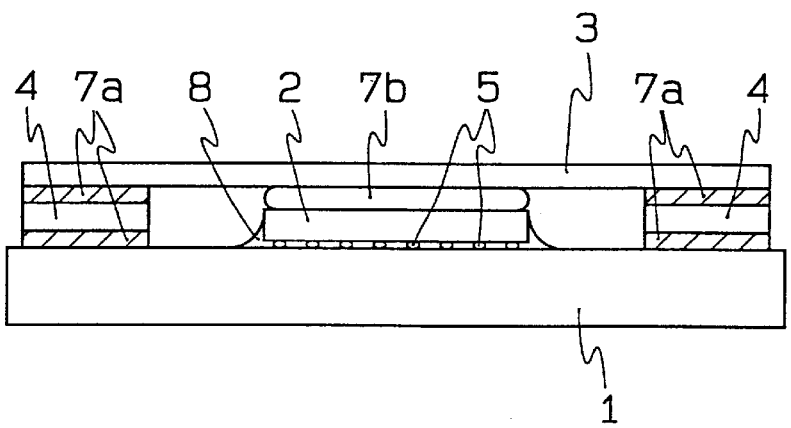
Figure 4C:
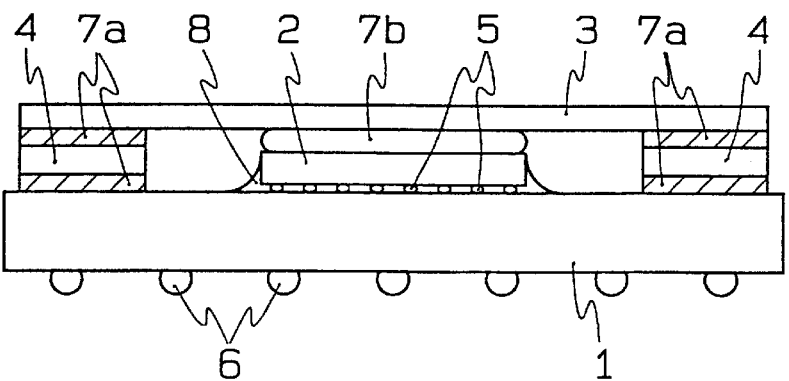

FIG. 1 is a partially cutaway view in perspective of one embodiment of the semiconductor device according to this invention, while FIG. 2 is a view illustrating a cross-section taken along line II—II in FIG. 1. In FIG. 1, numeral 1 designates a BGA substrate, numeral 2 a semiconductor chip, numeral 3 a heat spreader, numeral 4 a ring (frame), numeral 6 a solder ball, and numeral 8 a sealing member. In FIG. 2, same reference numerals designate the same parts or corresponding parts in FIG. 1. In addition, in FIG. 2, numeral 5 designates a solder bump, numeral 5c a solder bump on the outermost circumferential row (hereinafter, simply called the "outermost circumferential solder bump"), numeral 5d a solder bump on the innermost circumferential row (hereinafter, simply called the "innermost circumferential solder bump"), numeral 7a the first adhesive layer, numeral 7b the second adhesive layer, numeral 9 line, numeral 12 a via, and numeral 13 an insulating layer. The first adhesive layer 7a affixes BGA substrate 1 to the ring 4, as well as the heat spreader 3 to the ring 4, respectively. The second adhesive layer 7b affixes the semiconductor chip 2 to the heat spreader 3.

Each of the lines (not illustrated) provided in the BGA substrate 1 is electrically connected to the external electrodes (not illustrated) of the semiconductor device. The solder ball 6 comprises a soldering material and is to be electrically connected to the external electrode of the semiconductor device. A plurality of electrodes (not illustrated) of the semiconductor chip 2 are electrically connected to the specified line of the BGA substrate 1, respectively. The relevant connection is achieved by providing solder bumps in advance on each electrode surface of the semiconductor chip 2 and the electrode surface connected to each line of the BGA substrate 1, and by soldering using the relevant solder bumps. The sealing member 8 comprises sealing resin, and is provided to bring the semiconductor chip 2 in close contact with the BGA substrate 1.

The ring 4 has an opening provided at the center of the sheet-form member. The profile of the opening is decided in accordance with the profile of the semiconductor chip 2. The heat spreader 3 has a profile similar to that of the BGA substrate 1 and has a thin sheet form. The semiconductor chip 2 and heat spreader 3, the BGA substrate 1 and ring 4, and the heat spreader 3 and ring 4 are affixed using an adhesive. For the adhesive to affix the semiconductor chip 2 and the heat spreader 3, an epoxy adhesive which provides good heat resistance and good advantage in cost is employed. On the other hand, for the adhesive to affix the BGA substrate 1 and the ring 4, and the heat spreader 3 and the ring 4, a silicone adhesive which has small Young's modulus (E) is used for alleviating stress to the semiconductor chip 2.

The solder bumps 5 are arranged in a peripheral region of the semiconductor chip surface, excluding a center portion of the semiconductor chip surface, in the form of a matrix or in a staggered arrangement. The solder bump 5 joins an external electrode of the semiconductor chip 2 to an electrode on the surface side of the BGA substrate 1, and a solder ball 6 joins the external electrode on the rear surface side of the BGA substrate 1 to a circuit board. In this way, a construction in which input of the power supply or input and output of signals takes place is achieved between the semiconductor chip and the circuit board via line 9 and the via hole 12. Thus, the semiconductor chip is connected with the plurality of solder balls through a plurality of via holes for electrically connecting a plurality of lines provided on the top surface of the insulating layers.

The BGA substrate 1 comprises upper and lower insulating layers in each of which a plurality of insulating layers are laminated (built-up layer) and an intermediate insulating layer which serves as a rigid core. A plurality of electric wiring lines are provided on each surface of the insulating layers included in the upper, lower and intermediate insulating layers respectively, and a plurality of via holes are provided through each insulating layers for interlayer connection among electric wiring lines.

The BGA substrate 1 of the semiconductor device according to the present invention comprises organic material that matches thermal expansion characteristics of the circuit board in order to solve the problem arising from the thermal expansion. The thermal expansion characteristics are expressed as a coefficient of linear expansion in this specification.

With respect to the thermal expansion, for example, FR4 (glass cloth base material epoxy resin specified in ASTM D-1867 Specification) or BT resin (trade name; resin available from Mitsubishi Gas Chemical Co., Inc.) is used for the material of the circuit board, and their coefficients of linear expansion range from $1 \times 10^{-5}$ to $2 \times^{-5}/°$ C. According to the structure of the BGA substrate 1 as mentioned above, thermal expansion of the overall BGA substrate is most dependent on the intermediate insulating layer serving as a core, because of its dominant stiffness compared with those of the upper and lower laminated insulating layers.

Consequently, from the viewpoint of mounting reliability, coefficient of linear thermal expansion of the material used for the intermediate insulating layer (core) of the BGA substrate should be as close as possible to that of the material used for the circuit board. The best way to realizing the above is to use the same material for the core as that for the circuit board. Even if it is not the case, the difference of the linear thermal expansion coefficient between the two materials is preferable to be within $1 \times 10^{-5}/°$ C.

The thermal expansion of the upper and lower laminated insulating layers causes another problem which is interlayer peeling between different insulating layers within the BGA substrate. From this viewpoint, similarly, a small difference of the linear thermal expansion coefficient among the materials used within the BGA substrate is preferable, but it is not so strict as compared with the former case. A tolerable amount of the difference of thermal expansion coefficient is about $1 \times 10^{-4}/°$ C. in this case.

With this contrivance, the mounting reliability of the BGA is improved and at the same time the reliability of the BGA substrate itself (peeling proof) is improved.

For the material of the BGA substrate, epoxy resin and/or tetrafluoroethylene resin are used. The epoxy resin referred to in the present invention is a resin in which glass fiber, acrylic resin and the like is mixed with the epoxy resin. The tetrafluoroethylene resin referred to the present invention is a resin in which acrylic resin and the like are mixed with the tetrafluoroethylene resin.

The advantages of using an organic material for the material of the BGA substrate include (1) improvement in the mounting reliability, (2) achievement of low cost, and, in addition, (3) formation of an insulating layer with a dielectric constant of 3 to 5 or lower, so that a semiconductor device which can satisfy high-speed operation requirements can be produced.

Now, description is made of the manufacturing process of the semiconductor device. FIGS. 3(a)–3(d) and FIGS. 4(a)–4(c) are sectional views of one example of a manufacturing process of the semiconductor device according to the present invention. In FIGS. 3(a)–3(d) and FIGS. 4(a)–4(c), same reference numerals designate the same parts or corresponding parts in FIG. 1 and FIG. 2. Numeral 5a designates the first solder bump electrically connected to the external electrode (not illustrated) contained in the semiconductor chip 2, and numeral 5b designates the second solder bump electrically connected to the external electrodes (not illustrated) of a plurality of lines provided on the BGA substrate 1.

First of all, on the electrode contained in the semiconductor chip 2, the first solder bump 5a is provided, and similarly, the second solder bump 5b is provided on one end part of one of the plurality of lines of the BGA substrate 1 (see FIG. 3 (a)). Then, flux material is applied to the region on which the second solder bump 5b is formed on the surface of the BGA substrate 1. The semiconductor chip 2 is placed on the BGA substrate 1, and the BGA substrate 1 and the semiconductor chip 2 are charged into a heat treatment furnace (so-called a reflow furnace) with the first solder bump 5a held in contact with the second bump 5b. As a result, the first solder bump 5a and the second solder bump 5b melt, and the first solder bump 5a contacted with the second solder bump 5b become integral. In FIG. 3(b), the first solder bump integrally formed with the second solder bump is designated as the solder bump 5. By the solder bump 5, the electrode contained in the semiconductor chip 2 is electrically connected to one of the plurality of lines of the BGA substrate (see FIG. 3(b)). In addition, after cleaning the flux material, the ring 4 is affixed to the BGA substrate 1 by the first adhesive layer 7a (see FIG. 3(c)). Then, the sealing resin is injected into a clearance between the BGA substrate 1 and the semiconductor chip 2, and is allowed to solidify to form the sealing member 8, the semiconductor chip 2 is fixed in close contact with the BGA substrate 1. Then, an adhesive is applied to the top surface of the semiconductor chip 2 to form the second adhesive layer 7b (see FIG. 4(a)). After applying an adhesive to the top surface of the ring 4 to prepare the first adhesive layer 7a, the heat spreader 3 is placed on the semiconductor chip 2 and the ring 4, and the heat spreader 3 is affixed to the semiconductor chip 2 and the ring 4 (see FIG. 4(b)). Lastly, the solder balls 6 are provided on the external electrodes of the semiconductor device connected to the other ends of the plurality of lines of the BGA substrate 1 and a semiconductor device is obtained (see FIG. 4(c)).

Because, as described above, the BGA substrate material comprising a plurality of insulating layers is formed with organic material that matches the thermal expansion characteristics of the circuit board, a semiconductor device with improved reliability to thermal stress can be obtained.

Embodiment 2

The solder bump shown in FIG. 2 is mounted in a peripheral region, which is the border portion of the semiconductor chip surface. FIG. 5 is a plan view showing solder bumps mounted in a rectangular ring at the periphery of the semiconductor chip surface. The same reference numerals designate the same parts or corresponding parts in FIG. 1 and FIG. 2. Because the outermost circumferential solder bumps 5c are located on the outermost circumferential row of the ring-form region, the difference is maximized when thermal expansion of the semiconductor chip and that of the BGA substrate occur, respectively, and disconnection of the solder bump is likely to occur. Because the innermost circumferential solder bumps 5d are located on the innermost circumferential row of the ring-form region, stress caused by thermal shrinkage of the sealing member is great and disconnection of the solder bumps is likely to occur.

As described above, the outermost circumferential solder bumps and the innermost circumferential solder bumps have a problem in that disconnection is likely to occur due to large stress caused by thermal expansion or thermal shrinkage. The present embodiment is designed to align the positional relationship of the line on the insulating layer and the via hole between insulating layers with the problem taken into account, so that the line for power supply input to the semiconductor chip and the line for ground can be connected to the outermost circumferential solder bump 5c, the solder bump in the second row from the outermost solder bumps, and the innermost solder bump 5d. Since the line for power supply input and line for ground are equipped with auxiliary lines, respectively, even if any problem occurs in the joint of the solder bump due to thermal expansion of the semiconductor chip and thermal expansion of the BGA substrate, it would not affect at all the operational functions of the semiconductor chip. In addition, with respect to the outermost solder bumps, since the greatest thermal stress is exerted at four corners of the semiconductor chip, it is desirable not to provide connections using solder bumps. With this embodiment, a semiconductor device with improved reliability to thermal stress can be obtained.

Embodiment 3

In Embodiment 1 and Embodiment 2, a semiconductor device including the heat spreader and the ring was explained as one example of the semiconductor device, but the similar effects can be obtained even with the semiconductor device not including the heat spreader and the ring.

A semiconductor device according to the present invention comprises a BGA substrate composed of upper insulating layer in which a plurality of insulating layers are laminated, intermediate insulating layer, lower insulating layer in which a plurality of insulating layers are laminated; a plurality of lines provided on each top surface of the insulating layers included in the upper insulating layer, the intermediate insulating layer and lower insulating layer respectively; and a semiconductor chip having a plurality of electrodes to be connected to the plurality of lines respectively; wherein the semiconductor chip is connected with the plurality of solder balls through a plurality of via holes provided in each of all the insulating layers; and a material for the plurality of insulating layers comprises organic material which fits to thermal expansion characteristics of the substrate on which semiconductor device is mounted, and therefore, it is possible to obtain a semiconductor device with improved reliability to thermal stress.

A semiconductor device of the present invention has the thermal expansion characteristics of the circuit board expressed by the coefficient of linear expansion, wherein the difference of linear thermal expansion coefficient between the intermediate layer of the BGA substrate and the circuit board is within $1\times10^{-5}/°$ C., and the difference of linear thermal expansion coefficient among the materials within the BGA substrate is within $1\times10^{-4}/°$ C., therefore, it is possible to improve the mounting reliability.

A semiconductor device of this invention is desirable to contain at least one of the epoxy resin and tetrafluoroethylene resin for the said organic material.

A semiconductor device of this invention comprises a BGA substrate composed of upper insulating layer in which a plurality of insulating layers are laminated, intermediate insulating layer, lower insulating layer in which a plurality of insulating layers are laminated; a plurality of lines provided on each top surface of the insulating layers included in the upper insulating layer, the intermediate insulating layer and lower insulating layer respectively; a plurality of solder balls provided on the outermost surface of the lower insulating layer; and a semiconductor chip having a plurality of electrodes to be connected to the plurality of lines respectively, the semiconductor chip is connected with the plurality of solder balls through a plurality of via holes provided in each of all the insulating layers;

wherein the plurality of electrodes are provided in the ring-form region of the semiconductor chip and the power supply and grounding conductor are connected to electrodes on the outermost circumferential and innermost circumferential rows, respectively. Therefore, it is possible to obtain a semiconductor with improved reliability to thermal stress.

A semiconductor device according to this invention comprises a BGA substrate composed of upper insulating layer in which a plurality of insulating layers are laminated, intermediate insulating layer, lower insulating layer in which a plurality of insulating layers are laminated; a plurality of lines provided on each top surface of the insulating layers included in the upper insulating layer, the intermediate insulating layer and lower insulating layer respectively; a plurality of solder balls provided on the outermost surface of the lower insulating layer and a semiconductor chip having a plurality of electrodes to be connected to the plurality of lines respectively;

wherein the semiconductor chip is connected electrically with the plurality of solder balls through a plurality of via holes provided in each of all the insulating layers; a sealing member comprising sealing resin to bring the semiconductor chip in close contact with the BGA substrate, a heat spreader for discharging heat generated in the semiconductor chips to the outside, a ring providing a specified clearance between the BGA substrate and the heat spreader as well as joining them both, wherein a material for the insulating layers comprises by organic material which fits to the thermal expansion characteristics of a circuit board on which the semiconductor device is mounted, and it is possible to obtain a semiconductor device with improved reliability to thermal stress.

It should be understood that the apparatus and methods which have been shown and described herein are illustrative of the invention and are not intended be limitative thereof. Clearly, those skilled in the art may conceive of variations or modifications to the invention. However, any such variations or modifications which falls within the purview of this description are intended to be included therein as well. The scope of the invention is limited only by the claims appended hereto.

What is claimed is:

1. A semiconductor device comprising:
    a ball grid array (BGA) substrate including an upper insulating layer comprising a plurality of laminated layers, an intermediate insulating layer, and a lower insulating layer comprising a plurality of laminated insulating layers;
    a plurality of lines on top surfaces of the insulating layers included in each of the upper, intermediate, and lower layers, respectively;
    a plurality of solder balls disposed on an outermost surface of the lower insulating layer; and
    a semiconductor chip having a plurality of electrodes connected to respective lines, the semiconductor chip being connected electrically to the plurality of solder balls through a plurality of via holes in each of the upper, lower, and intermediate insulating layers wherein the intermediate insulating layer is a material having thermal expansion characteristics substantially matching thermal expansion characteristics of a circuit board, the semiconductor device being mounted on the circuit board, and the upper and lower insulating layers have thermal expansion characteristics different from but similar to that of the intermediate insulating layer so that interlayer peeling of the BGA substrate is prevented.

2. The semiconductor device of claim 1, wherein the BGA substrate and the circuit board have respective linear thermal expansion coefficients and the linear thermal expansion coefficients of the intermediate layer of the BGA substrate and of the circuit board differ by less than $1 \times 10^{-5}/°C$., and the linear thermal expansion coefficients of materials within the BGA substrate differ by less than $1 \times 10^{-4}/°C$.

3. The semiconductor device of claim 1, wherein the intermediate insulating layer is at least one of an epoxy resin and tetrafluoroethylene resin.

4. The semiconductor device of claim 1, wherein the plurality of electrodes are arranged in rows in a circumferential peripheral region of the semiconductor chip, and a power supply and ground are connected to the electrodes in outermost circumferential rows or innermost circumferential rows.

5. A semiconductor device comprising:

a ball grid array (BGA) substrate including an upper insulating layer comprising a plurality of laminated layers, an intermediate insulating layer, and a lower insulating layer comprising a plurality of laminated insulating layers;

a plurality of lines on top surfaces of the insulating layers included in each of the upper, intermediate, and lower layers, respectively;

a plurality of solder balls disposed on an outermost surface of the lower insulating layer;

a semiconductor chip having a plurality of electrodes connected to respective lines, wherein the semiconductor chip is connected electrically to the plurality of solder balls through a plurality of via holes in each of the upper, lower, and intermediate insulating layers;

a sealing member comprising a sealing resin, bringing the semiconductor chip into contact with the BGA substrate;

a heat spreader for discharging heat generated in the semiconductor chip; and a frame providing a separation between the BGA substrate and the heat spreader and joining the BGA substrate to the heat spreader, wherein the intermediate insulating layer is a material having thermal expansion characteristics substantially matching thermal expansion characteristics of a circuit board, the semiconductor device being mounted on the circuit board, and the upper and lower insulating layers have thermal expansion characteristics different from but similar to that of the intermediate insulating layer so that interlayer peeling of the BGA substrate is prevented.

* * * * *

UNITED STATES PATENT AND TRADEMARK OFFICE
CERTIFICATE OF CORRECTION

PATENT NO. : 6,317,333 B1
DATED : November 13, 2001
INVENTOR(S) : Shinji Baba

Page 1 of 1

It is certified that error appears in the above-identified patent and that said Letters Patent is hereby corrected as shown below:

<u>Column 5,</u>
Line 27, change "$2x\ ^{-5}/°C$" to -- $2x\ 10^{-5}/°C$ --.

Signed and Sealed this

Twenty-third Day of April, 2002

*Attest:*

JAMES E. ROGAN
*Attesting Officer*     *Director of the United States Patent and Trademark Office*